US012804843B2

(12) United States Patent
He et al.

(10) Patent No.: US 12,804,843 B2
(45) Date of Patent: Nov. 17, 2026

(54) VENT COVER FOR AN INFORMATION HANDLING SYSTEM

(71) Applicant: Dell Products L.P., Round Rock, TX (US)

(72) Inventors: Qinghong He, Austin, TX (US); Jeffrey Scott Smith, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 470 days.

(21) Appl. No.: 18/495,432

(22) Filed: Oct. 26, 2023

(65) Prior Publication Data

US 2025/0142762 A1 May 1, 2025

(51) Int. Cl.
*H05K 7/20* (2006.01)
*G06F 1/20* (2006.01)

(52) U.S. Cl.
CPC ......... *H05K 7/20136* (2013.01); *G06F 1/203* (2013.01)

(58) Field of Classification Search
CPC ..... H05K 7/20136; G06F 1/203; G06F 1/182; G06F 1/20
USPC .......................................................... 454/358
See application file for complete search history.

(56) References Cited

U.S. PATENT DOCUMENTS 5,938,525 A * 8/1999 Birdsong .............. F24F 13/065 454/324
2011/0019358 A1* 1/2011 Liao .......................... G06F 1/20 361/679.46
2016/0098068 A1* 4/2016 Liu ........................... G06F 1/20 361/679.5
2016/0328343 A1* 11/2016 Foster ................. G06F 13/4068

FOREIGN PATENT DOCUMENTS

DE 102005011698 A1 * 9/2006 .............. F24F 13/06

* cited by examiner

*Primary Examiner* — Allen R. B. Schult
*Assistant Examiner* — Charles R Brawner
(74) *Attorney, Agent, or Firm* — McDermott Will & Schulte LLP

(57) ABSTRACT

A vent cover for an information handling system including: a body having a first surface and a second surface opposite to the first surface; and a plurality of slots positioned within the body and extending between the first and the second surface, the plurality of slots including: first slots having a first length and extending between a first diameter and a second diameter of a first annulus; and second slots having a second length and extending between the second diameter and a third diameter of a second annulus, the first annulus including the second annulus.

13 Claims, 7 Drawing Sheets

VENT COVER FOR AN INFORMATION HANDLING SYSTEM

BACKGROUND

Field of the Disclosure

The disclosure relates generally to an information handling system, and in particular, a vent cover for the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Vent covers for information handling systems can facilitate regulation of a temperature of the information handling system. The vent covers can facilitate airflow while minimizing dust and debris from entering the information handling system.

SUMMARY

Innovative aspects of the subject matter described in this specification may be embodied in a vent cover for an information handling system including a body having a first surface and a second surface opposite to the first surface; and a plurality of slots positioned within the body and extending between the first and the second surface, the plurality of slots including: first slots having a first length and extending between a first diameter and a second diameter of a first annulus; and second slots having a second length and extending between the second diameter and a third diameter of a second annulus, the first annulus including the second annulus.

Other embodiments of these aspects include corresponding systems and apparatus.

These and other embodiments may each optionally include one or more of the following features. For instance, a plurality of ribs positioned within the body, the plurality of ribs extending between the first diameter and the second diameter of the first annulus. Each of the ribs includes: a first contiguous portion extending between the first diameter and the third diameter of a third annulus, the first annulus including the third annulus; and a second portion extending between the second diameter and the third diameter of the second annulus, the second portion including at least two spaced-apart projecting parts. The two spaced-apart projection parts define a respective second slot of the second slots therebetween. Adjacent ribs of the plurality of ribs define a respective first slot therebetween, wherein the first length greater than the second length. A first width of the first slots and a second width of the second slots are substantially the same. A magnitude of both the first width and the second width is approximately 0.95 millimeters. The ribs are substantially straight. The ribs are curved. The ribs are curved opposite to a rotation direction of a fan of the information handling system, the vent cover in superimposition with the fan. The ribs are curved in alignment with a rotation direction of a fan of the information handling system, the vent cover in superimposition with the fan. An area of the first slots between the first diameter and the third diameter of the third annulus is substantially the same as an area of the first slots and the second slots between the second diameter and the third diameter of the second annulus.

Particular implementations of the subject matter described in this specification can be implemented so as to realize one or more of the following advantages. For example, the vent cover can lower acoustical noise from a fan of the information handling system while having negligible impact on thermal cooling of the information handling system.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
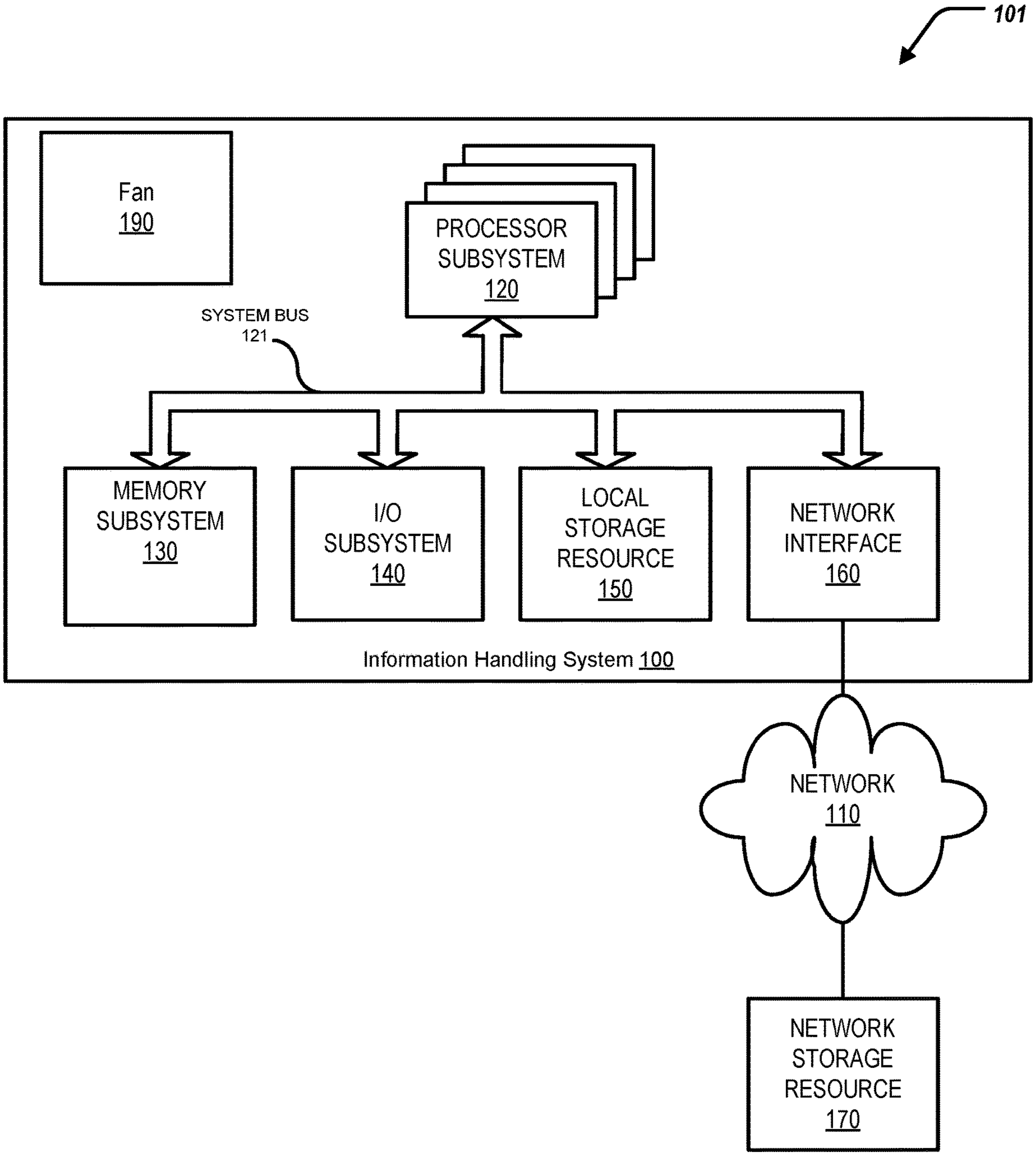
FIG. 1 is a block diagram of selected elements of an embodiment of an information handling system.

This disclosure discusses a vent cover of an information handling system. In short, a vent cover can facilitate thermal cooling of a fan of the information handling system, while reducing noise generated by the fan. In particular, the specific layout of ribs of the vent cover and the shape of the ribs can reduce noise generated by the fan.

Specifically, this disclosure discusses a vent cover for an information handling system including: a body having a first surface and a second surface opposite to the first surface; and a plurality of slots positioned within the body and extending between the first and the second surface, the plurality of slots including: first slots having a first length and extending between a first diameter and a second diameter of a first annulus; and second slots having a second length and extending between the second diameter and a third diameter of a second annulus, the first annulus including the second annulus.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-7 wherein like numbers are used to indicate like and corresponding parts.

Turning now to the drawings, FIG. 1 illustrates a block diagram depicting selected elements of a computing environment 101 including an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

The information handling system 100 can further include a fan 190.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
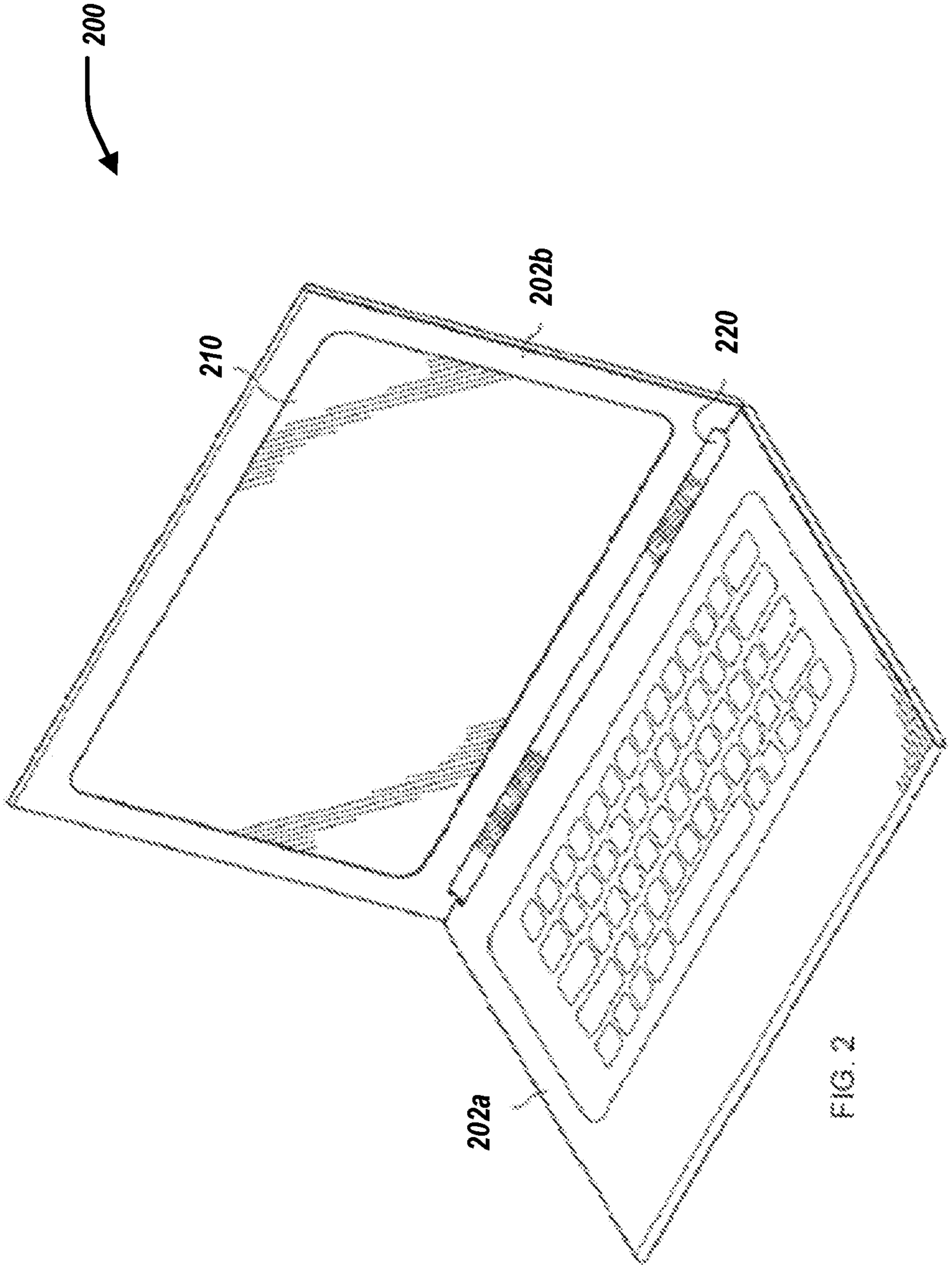
FIG. 2 illustrates a perspective view of the information handling system.

FIG. 2 illustrates a perspective view of an information handling system 200. The information handling system 200 can include a first body **202*a* and a second body 202*b* (collectively referred to as bodies 202). The second body 202*b* can include a display 210. A hinge 220 can couple the first body 202*a* to the second body 202*b*. In some examples, the information handling system 200 is similar to, or includes, the information handling system 100 of FIG. 1**.

Figure 3:
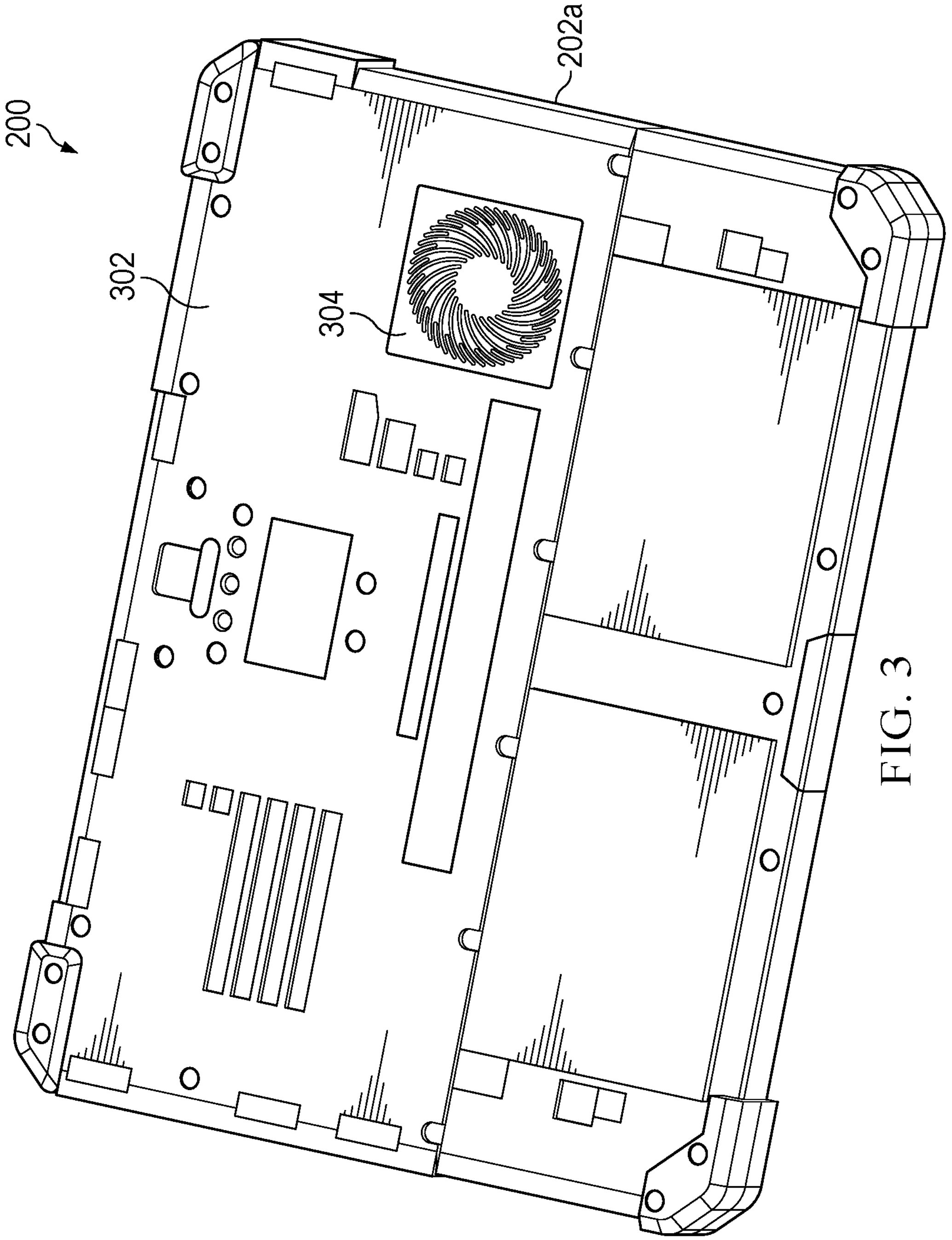
FIG. 3 illustrates a bottom up view of the information handling system.

FIG. 3 illustrates a bottom up perspective view of the information handling system 200. The first body **202*a* can include a cover 302 (e.g., a "D" cover). The cover 302 can include a vent cover 304**.

Figure 4:
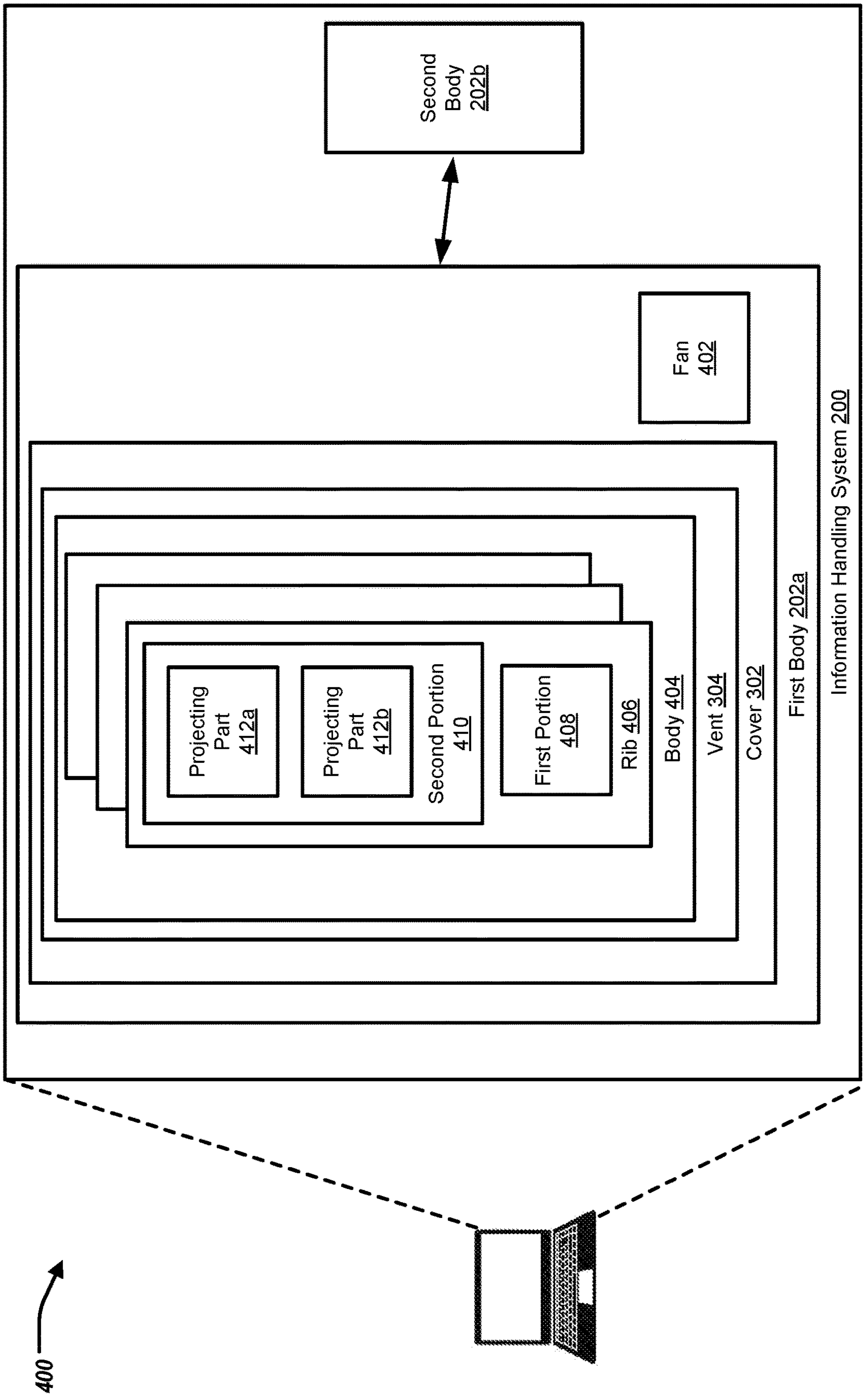
FIG. 4 illustrates a block diagram of the information handling system.

Turning to FIG. 4, FIG. 4 illustrates an environment 400 including the information handling system 200. The information handling system 202 can include the first body **202*a* and the second body 202*b*. The first body 202*a* can include the cover 302 and a fan 402. The cover 302 can include the vent cover 304. The vent cover 304 can include a body 404. The body 404 can include a plurality of ribs 406. Each rib 406 can include a first portion 408 and a second portion 410. The second portion 410 can include a first projecting part 412*a* and a second projecting part 412*b* (collectively referred to as projecting parts 412**).

Figure 5:
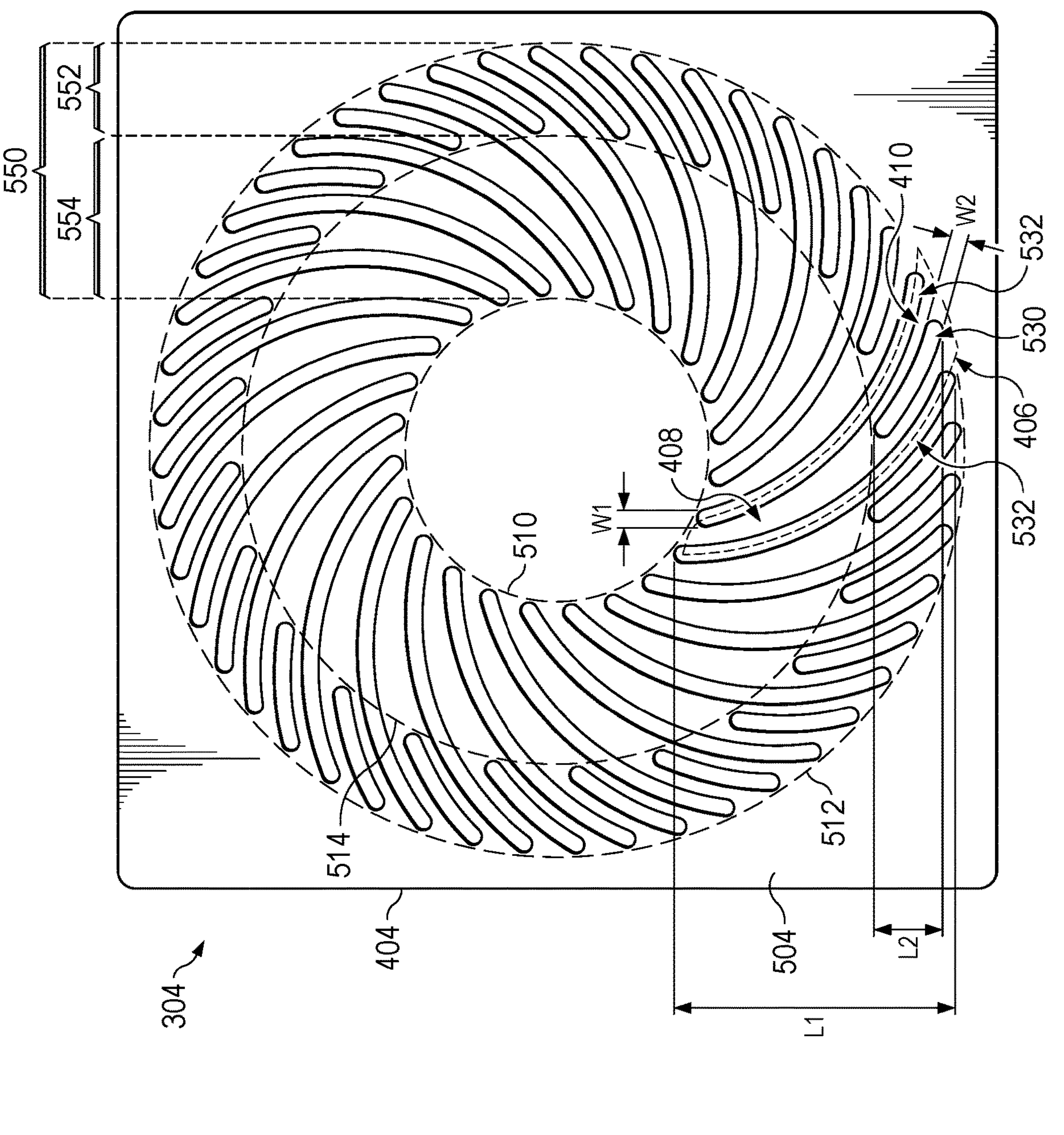
FIG. 5 illustrates the vent cover.
Figure 6:
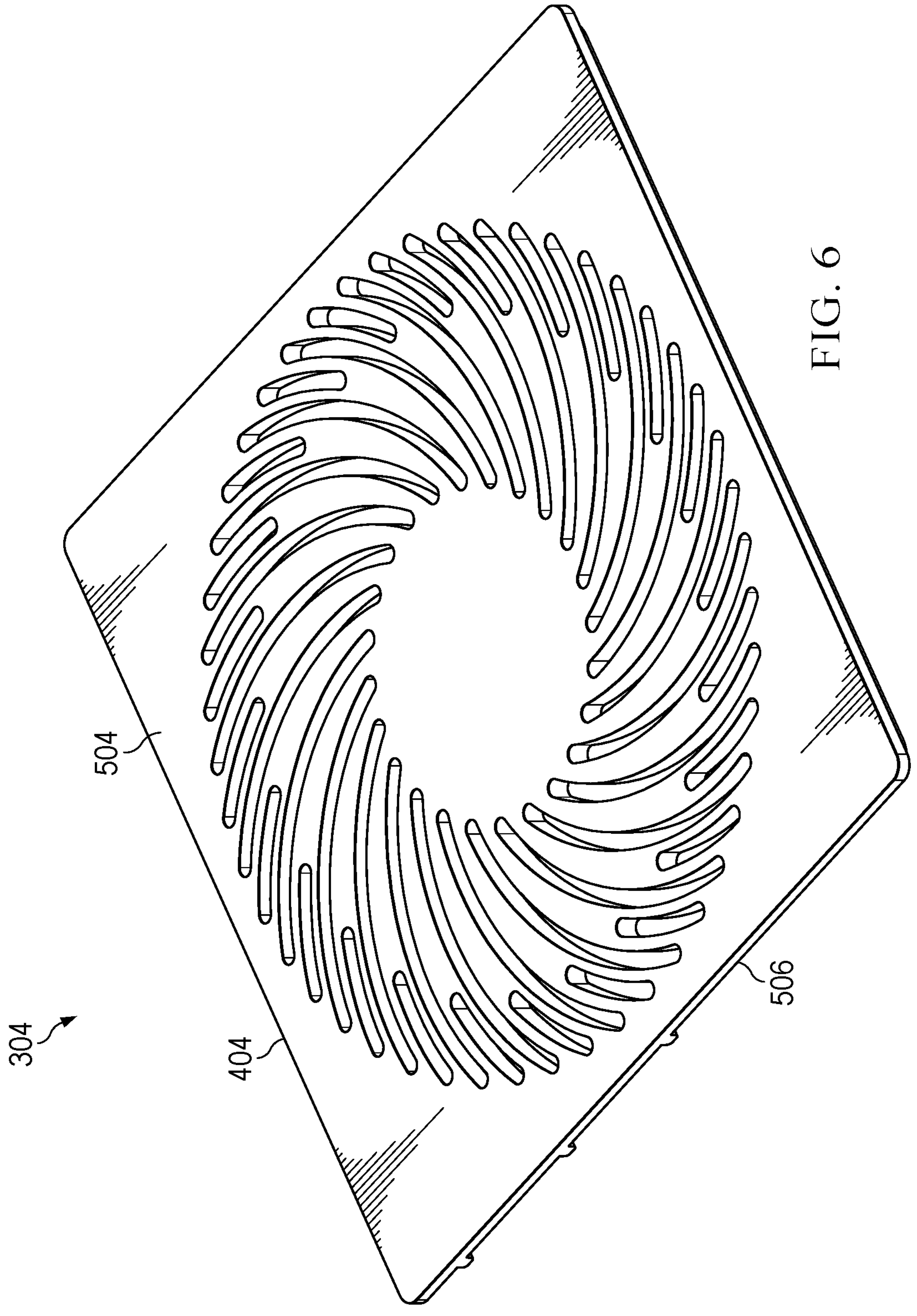
FIG. 6 illustrates a perspective view of the vent cover.
Figure 7:
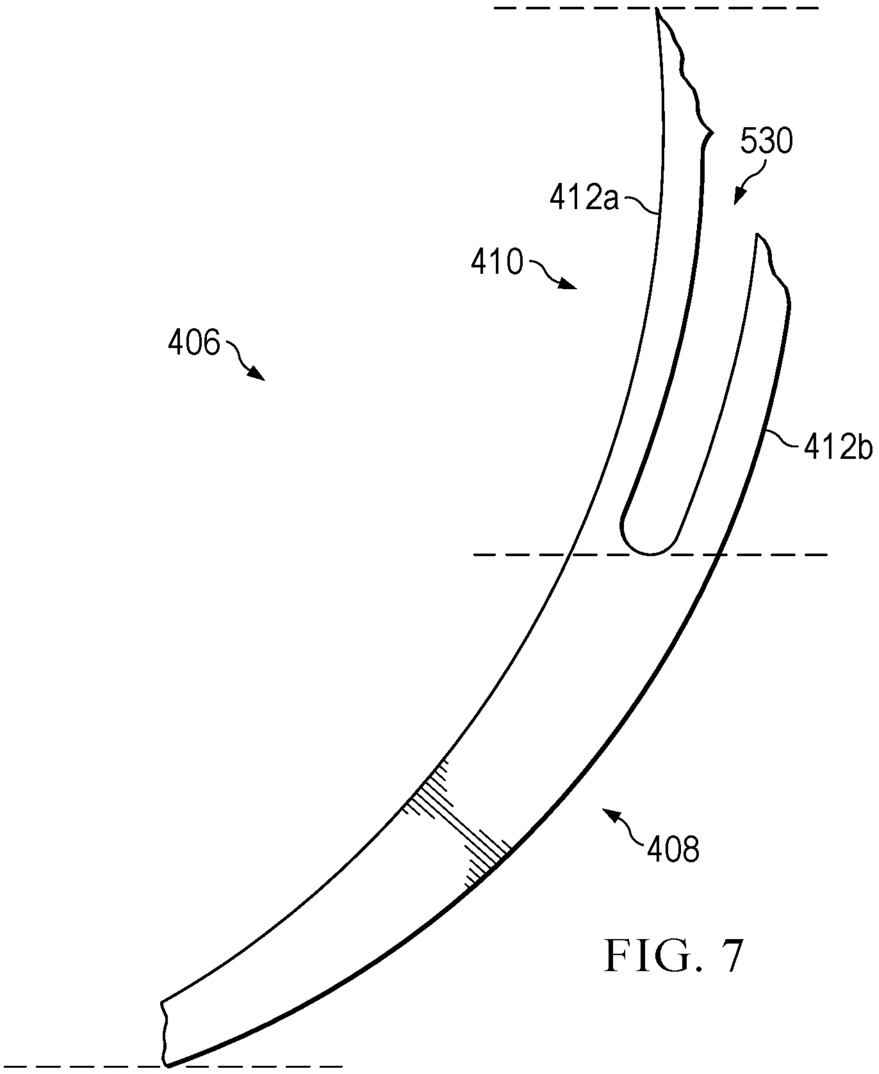
FIG. 7 illustrates a rib of the vent cover.

FIG. 5 illustrates a top down view of the vent cover 304; FIG. 6 illustrates a perspective view of the vent cover 304; and FIG. 7 illustrates the rib 406. Referring to FIGS. 5, 6, and 7, the vent cover 304 includes the body 404. The body 404 can include a first surface 504 and a second surface 506 (shown in FIG. 6). The second surface 506 is opposite to the first surface 504. The vent cover 304 can include the plurality of ribs 406. The ribs 406 can be positioned within the body 502. The ribs 406 extend between a first diameter 510 and a second diameter 512 of a first annulus 550 of the body 502.

Each of the ribs 406 includes the first contiguous portion 408 that extends between the first diameter 510 and a third diameter 514 of a third annulus 554. The first annulus 550 includes the third annulus 554. The third diameter 514 is between the first diameter 510 and the second diameter 512. Further, each of the ribs 406 includes the second portion 410 extending between the second diameter 512 and the third diameter 514 of a second annulus 552. The first annulus 550 includes the second annulus 552. The second portion 410 includes the spaced-apart projecting parts **412*a*, 412*b*. That is, the rib 406 is bifurcated to form the projecting parts 412**.

In some examples, each of the adjacent ribs 406 define a slot 532 therebetween. The slots 532 has a first length L1 and a first width W1. The spaced-apart projecting parts 412 define a slot 530 therebetween. The slot 530 has a second length L2 and a second width W2. The slots 530, 532 extend between the first surface 504 and the second surface 506. In some examples, the first length L1 of the slot 532 is greater than the second length L2 of the slot 530. In some examples, the second width W2 of the slot 530 is substantially the same as the first width W1 of the slot 532. In some examples, the second width W2 and the first width W1 is 0.95 millimeters. In some examples, the second width W2 differs from the second width W2.

In short, the vent cover 304 can facilitate thermal cooling of the fan 402, while reducing noise generated by the fan 402. In particular, the specific layout of the ribs 406, the shape of the ribs 406, the slots 530, 532 and the shape of the slots 530, 532 can reduce noise generated by the fan 402.

In some examples, the slots 530 can have a first area between the first diameter 510 and the third diameter 514 of the third annulus 554; and the slots 530 and the slots 532 can have a second area between the third diameter 514 and the second diameter 512 of the second annulus 552. In some examples, the first area of the slots 530 between the first diameter 510 and the third diameter 514 of the third annulus 554 is substantially the same as the second area of the slots 530 and the slots 532 between the third diameter 514 and the second diameter 512 of the second annulus 552. That is, the "open" percentage of the vent cover 304 (via the slots 530 and the slots 532) is substantially the same between the first diameter 510 and the third diameter 514 of the third annulus 554 and between the third diameter 514 and the second diameter 512 of the second annulus 552. Thus, system noise levels and tones can be reduced (e.g., produced by the fan 402).

In some examples, the ribs 406 are substantially straight between the first diameter 510 and the second diameter 512 of the first annulus 550. In some examples, a subset of the ribs 406 are substantially straight between the first diameter 510 and the second diameter 512 of the first annulus 550. In some examples, each of the ribs 406 are substantially straight between the first diameter 510 and the second diameter 512 of the first annulus 550.

In some examples, the ribs 406 are curved between the first diameter 510 and the second diameter 512 of the first annulus 550. In some examples, a subset of the ribs 406 are curved between the first diameter 510 and the second diameter 512 of the first annulus 550. In some examples, each of the ribs 406 are curved between the first diameter 510 and the second diameter 512 of the first annulus 550. In some examples, the ribs 406 are curved opposite to a rotation direction of the fan 402. That is, the vent cover 304 is in superimposition with the fan 402. The fan 402 can rotate in a direction—e.g., clockwise or counter-clockwise. When the fan 402 rotates in a clockwise direction, the ribs 406 can curve in a counter-clockwise direction. When the fan 402 rotates in a counter-clockwise direction, the ribs 406 can curve in a clockwise direction.

In some examples, the vent cover 304 can reduce noise generated by the fan 402 while having negligible impact on thermal cooling of the information handling system 202.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A vent cover for an information handling system including:

a body having a first surface and a second surface opposite to the first surface; and a plurality of slots positioned within the body and extending between the first and the second surface, the plurality of slots including:

first slots having a first length and extending between a first diameter and a second diameter of a first annular region; and second slots having a second length and extending between the second diameter and a third diameter of a second annular region, the first annular region including the second annular region;

a plurality of ribs positioned within the body, the plurality of ribs extending between the first diameter and the second diameter of the first annular region, wherein each of the ribs includes:

a first contiguous portion extending between the first diameter and the third diameter of a third annular region, the first annular region including the third annular region; and a second portion extending between the second diameter and the third diameter of the second annular region, the second portion including at least two spaced-apart projecting parts, wherein an area of the first slots between the first diameter and the third diameter of the third annular region is substantially the same as an area of the first slots and the second slots between the second diameter and the third diameter of the second annular region.

2. The vent cover of claim 1, wherein the two spaced-apart projection parts define a respective second slot of the second slots therebetween.

3. The vent cover of claim 2, wherein adjacent ribs of the plurality of ribs define a respective first slot therebetween, wherein the first length greater than the second length.

4. The vent cover of claim 1, wherein a first width of the first slots and a second width of the second slots are substantially the same.

5. The vent cover of claim 2, wherein a magnitude of both the first width and the second width is 0.95 millimeters.

6. The vent cover of claim 1, wherein the ribs are curved.

7. The vent cover of claim 6, wherein the ribs are curved opposite to a rotation direction of a fan of the information handling system, the vent cover in superimposition with the fan.

8. The vent cover of claim 6, wherein the ribs are curved in alignment with a rotation direction of a fan of the information handling system, the vent cover in superimposition with the fan.

9. The information handling system of claim 1, wherein a first width of the first slots and a second width of the second slots are substantially the same.

10. The information handling system of claim 9, wherein a magnitude of both the first width and the second width is 0.95 millimeters.

11. An information handling system, comprising:

a processor;

memory media storing instructions executable by the processor to perform operations;

a vent cover, including:

a plurality of slots positioned within the body and extending between the first and the second surface, the plurality of slots including:

first slots having a first length and extending between a first diameter and a second diameter of a first annular region; and second slots having a second length and extending between the second diameter and a third diameter of a second annular region, the first annular region including the second annular region;

a plurality of ribs positioned within the body, the plurality of ribs extending between the first diameter and the second diameter of the first annular region, wherein each of the ribs includes:

a first contiguous portion extending between the first diameter and the third diameter of a third annular region, the first annular region including the third annular region; and a second portion extending between the second diameter and the third diameter of the second annular region, the second portion including at least two spaced-apart projecting parts, wherein an area of the first slots between the first diameter and the third diameter of the third annular region is substantially the same as an area of the first slots and the second slots between the second diameter and the third diameter of the second annular region.

12. The information handling system of claim 11, wherein the two spaced-apart projection parts define a respective second slot of the second slots therebetween.

13. The information handling system of claim 12, wherein adjacent ribs of the plurality of ribs define a respective first slot therebetween, wherein the first length greater than the second length.

* * * * *